United States Patent [19]

Itagaki

[11] Patent Number: 4,841,247

[45] Date of Patent: Jun. 20, 1989

[54] METHOD FOR INTERPOLATIVE EXTENSION OF NUCLEAR MAGNETIC RESONANCE IMAGE

[75] Inventor: Hidenobu Itagaki, Amagasaki, Japan

[73] Assignee: Mitsubishi Denki Kabushiki Kaisha, Tokyo, Japan

[21] Appl. No.: 203,552

[22] Filed: May 31, 1988

Related U.S. Application Data

[63] Continuation of Ser. No. 912,750, Sep. 26, 1986.

[30] Foreign Application Priority Data

Oct. 15, 1985 [JP] Japan ................................ 60-229051

[51] Int. Cl.$^4$ .......................................... G01R 33/20
[52] U.S. Cl. .................................................... 324/309
[58] Field of Search ................ 324/309, 312; 364/413, 364/414, 726; 382/41, 44, 47; 358/22, 180

[56] References Cited

U.S. PATENT DOCUMENTS

| 4,070,611 | 1/1978 | Ernst .................................... 324/312 |
| 4,569,081 | 2/1986 | Mintzer et al. ....................... 382/47 |
| 4,581,762 | 4/1986 | Lapidus et al. ....................... 382/22 |
| 4,630,307 | 12/1986 | Cok ...................................... 382/22 |
| 4,631,751 | 12/1986 | Anderson et al. .................... 382/47 |

FOREIGN PATENT DOCUMENTS

2079946  1/1982  United Kingdom .

OTHER PUBLICATIONS

Robert G. Keys; "Cubic Convolution Interpolation for Digital Image Processing"; IEEE Transactions on Acoustics, Speech, and Signal Processing; vol. AS-SP-29, No. 6, Dec. 1981, pp. 1153-1160.

William K. Pratt; "Digital Image Processing"; Title pages and pp. 112-116; 1978; John Wiley & Sons, New York.

Z. H. Cho et al; "Computer Modeling and Simulation of Fourier Transformation NMR Imaging"; Title pages and Chapter 35 (pp. 453-486) of Nuclear Magnetic Resonance Imaging, 1983, W. D. Saunders, Philadelphia.

W. A. Edelstein, et al., "Physics of Medical Biology", 25: 751, vol. 25, 1980, pp. 751-756.

Primary Examiner—Stewart J. Levy
Assistant Examiner—Lawrence G. Fess
Attorney, Agent, or Firm—Flynn, Thiel, Boutell & Tanis

[57] ABSTRACT

A nuclear magnetic resonance image used for detecting the internal state of a substance is obtained through a phenomenon of nuclear magnetic resonance, which is spin resonance of atomic nuclei, by two-dimensionally sampling a nuclear magnetic resonance signal representative of the information of atomic nuclei in a test piece and then changing the two-dimensional data by two-dimensional Fourier transformation. Interpolative extension of the image is achieved without causing any reduction of the resolution by, in execution of such Fourier transformation, zero-filling the data in at least one of the column and row directions in accordance with the extension rate and increasing the number of the two-dimensional data.

11 Claims, 3 Drawing Sheets

FIG. 1
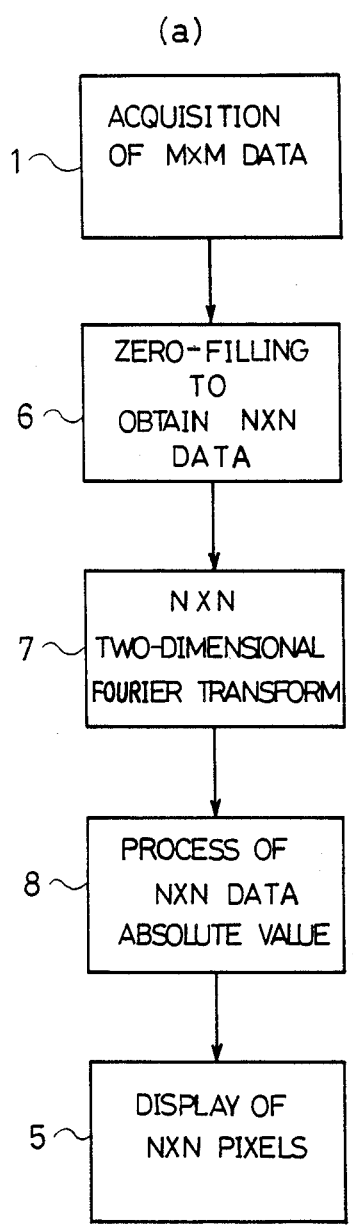
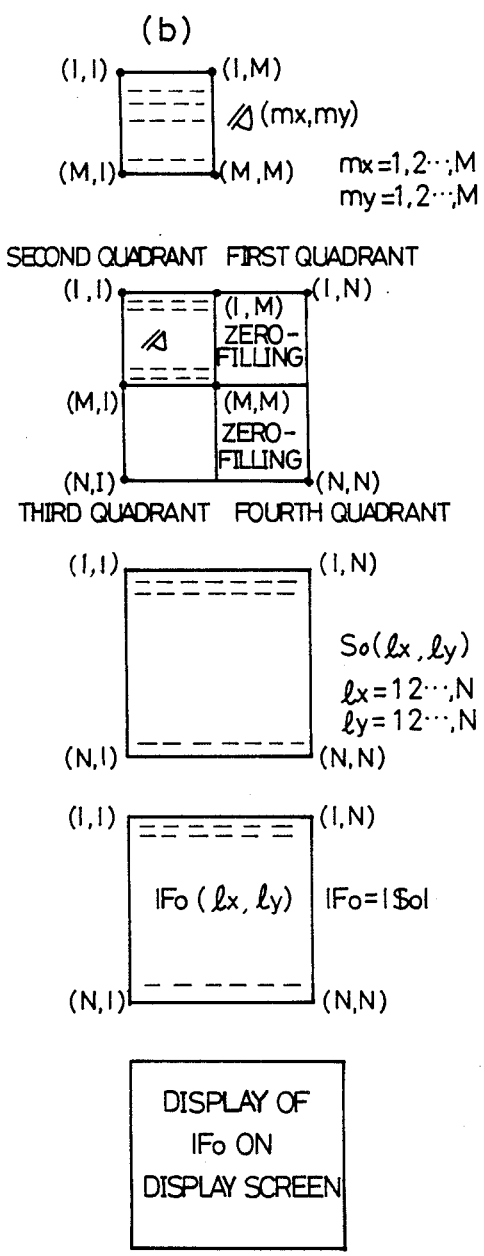

METHOD FOR INTERPOLATIVE EXTENSION OF NUCLEAR MAGNETIC RESONANCE IMAGE

This application is a continuation of U.S. Ser. No. 912,750 filed Sept. 26, 1986.

BACKGROUND OF THE INVENTION

1. Field of the Invention

The present invention relates to a method for interpolative extension of a nuclear magnetic resonance image obtained by an imaging system utilizing a phenomenon of nuclear magnetic resonance (NMR).

2. Description of the Prior Art

A nuclear magnetic resonance image (hereinafter referred to as MR image) is formed of two-dimensional position data based on a nuclear magnetic resonance signal (hereinafter referred to as NMR signal) which is produced by utilizing a phenomenon of nuclear magnetic resonance and represents the spin density, relaxation time or related information of specific atomic nuclei existing in a test piece. FIG. 2 shows an exemplary pulse sequence for obtaining an NMR signal disclosed in British Patent Specification No. 2,079,946; and FIG. 3 shows the procedure of producing an MR image from an NMR signal, in which (a) is a flow chart of a conventional method for interpolative extension of the MR image, and (b) typically illustrates the process in the flow chart correspondingly to the individual steps thereof.

Detailed descriptions on the NMR imaging have already been known in various books and papers (e.g. Edelstein W. A. et al., "Physics of Medical Biology" 25: 751 (1980); NMR Medical Study Society (ed.), "NMR Medicine", Maruzen). Therefore, an explanation will be given here principally on how to produce an image from the NMR signal obtained in the pulse sequence of FIG. 2.

In FIG. 2, Gx and Gy represent a phase-encoding magnetic field and a frequency-encoding magnetic field, respectively. Suppose now that, for explanation, an NMR signal is obtained by systematically changing Gx M times (normally M is so selected as to be a power of 2, such as 128 or 256). Referring to FIG. 3 (b) which typically illustrates the process executed in (a), the NMR signal phase-encoded by the first magnetic field Gx is digitized by A-D conversion M times during the sampling period shown in FIG. 2, and the data is inserted into an array of $\emptyset$ (1, my) where my=1, 2, 3, ..., M. Similarly, the signal encoded by the next magnetic field Gx is inserted into $\emptyset$ (2, my). And finally by the Mth magnetic field Gx changed systematically, there is obtained a two-dimensional array $\emptyset$ (mx, my) where mx=1, 2, ..., M; and my=1, 2, ..., M, in which the NMR signal is existent [step 1]. The array $\emptyset$ (mx, my) is then changed by two-dimensional Fourier transformation of M×M [step 2], and if the two-dimensional array of complex thus obtained is $ (kx, ky) where kx=1, 2, ..., M and ky=1, 2, ..., M, a two-dimensional array F having an absolute value $ expressed as $F(kx, ky) = |\$(kx, ky)|$ becomes an MR image of M×M pixels [step 3]. And N×N pixels (e.g. in double extension where N=2×M) are processed by linear interpolation to achieve extension [step 4], thereby forming a two-dimensional array G (lx, ly) where lx=1, 2, ..., N and ly=1, 2, ..., N which represents the image. In this case, the image G extended by linear interpolation is obtained from the array F in the following manner:

$$G(2kx, 2ky) = F(kx, ky)$$

where $kx = 1, 2, \ldots, M$
$ky = 1, 2, \ldots, M$ $$G(2kx + 1, 2ky) = (F(kx, ky) + F(kx + 1, ky))/2$$

where $kx = 1, 2, \ldots, M - 1$
$ky = 1, 2, \ldots, M$ $$G(2kx, 2ky + 1) = (F(kx, ky) + F(kx, ky + 1))/2$$

where $kx = 1, 2, \ldots, M$
$ky = 1, 2, \ldots, M - 1$ $$G(2kx + 1, 2ky + 1) = (F(kx, ky) + F(kx + 1, ky) + F(kx, ky + 1) + F(kx + 1, ky + 1))/4$$

where $kx = 1, 2, \ldots, M - 1$
$ky = 1, 2, \ldots, M - 1$

And the image G of N x N pixels extended by linear interpolation is displayed [step 5].

However, in the conventional method for interpolative extension of an MR image, first an image is once formed as mentioned above and then is extended on its planar space by linear interpolation, so that due to the principle of such linear interpolation, some problems are unavoidable including that the image after interpolative extension becomes indistinct to eventually bring about a reduction in the resolution.

SUMMARY OF THE INVENTION

It is a principal object of the present invention to provide an improved method of extending an MR image by interpolation without inducing any reduction in its resolution.

Another object of the invention resides in realizing fast interpolative extension while retaining a high resolution without the necessity of additionally connecting any particular device to the conventional apparatus.

Further objects of the invention as well as features and advantages thereof will become manifest from the following detailed description given with reference to the accompanying drawings.

BRIEF DESCRIPTION OF THE DRAWINGS

FIG. 1 illustrates an exemplary embodiment of the present invention, in which (a) is a flow chart and (b) typically shows data corresponding to the individual steps in the flow chart (a);

DESCRIPTION OF THE PREFERRED EMBODIMENT

Figure 3:
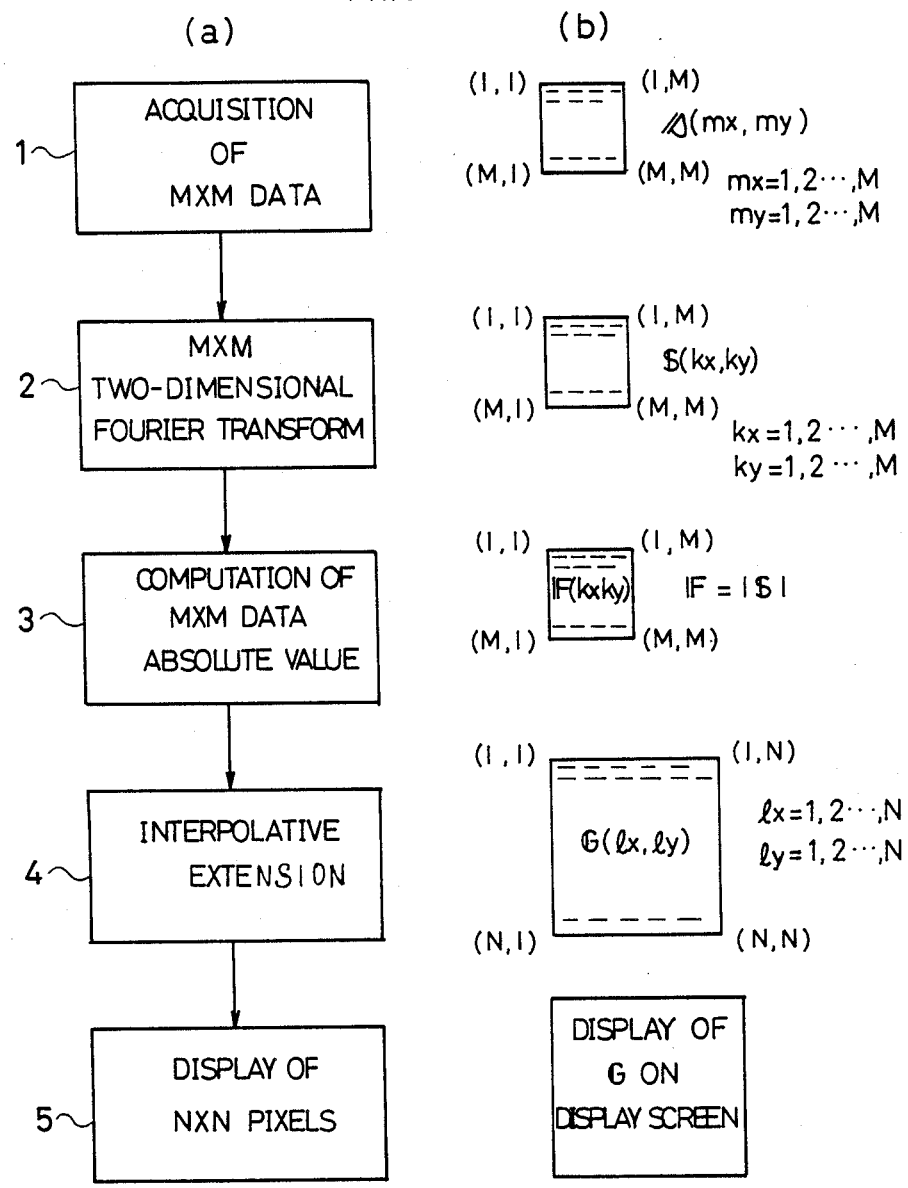
FIG. 3 shows a flow chart and a typical procedure to carry out a conventional method for interpolative extension of an MR image.

Hereinafter an exemplary embodiment of the present invention will be described with reference to the drawings. FIG. 1 (a) is a flow chart showing how interpolative extension is carried out for a sampled NMR signal, and FIG. 1 (b) typically shows data corresponding to the individual steps in the flow chart (a). The step 1 shown in (a) and the data $\emptyset$ (mx, my) in (b) are the same as those shown in FIG. 3.

Referring first to (b), the NMR signal data ∅ (mx, my) (where mx=1, 2, ..., M; and my=1, 2, ..., M) sampled M×M times in step 1 is considered here to be in the second quadrant of the image after extension, and zero-filling is executed to fill zero in each of the first, third and fourth quadrants [step 6] to obtain N×N pieces of data (e.g. N=2×M). Thus, the extension rate or factor is 2, where the extension rate or factor is defined to be N/M. The data is then changed by two-dimension Fourier Transformation to produce N×N two-dimensional complex matrix $_0$(lx, ly) (where x=1, 2, ..., N; and y=1, 2, ..., N) [step 7]. Subsequently, the absolute value of the matrix $_0$ is taken to obtain a two-dimensional matrix $F_0$ where $F_0$ (lx, ly)=|$_0$ (lx, ly)|, and the luminance change corresponding to the value of $F_0$ is displayed [step 5]. In this stage, $F_0$ is naturally N×N matrix data.

The above method is capable of preventing a reduction in the resolution of the interpolatively extended image as mentioned. Since Fourier transformation is frequently used in the apparatus of this type, a high-speed processor for fast Fourier transformation is incorporated in such apparatus, and interpolative extension based on Fourier transformation is executed by utilizing the rapid processor operation, whereby a high resolution can be retained in the fast interpolative extension without the necessity of additionally installing any particular device.

Although in the above embodiment the sampled NMR signal data ∅ (mx, my) is considered to be in the second quadrant, it is a matter of course that the same effect is also attainable when it is in any other quadrant.

Even in case the data ∅ (mx, my) is considered to be astride the individual quadrants, still the same effect can be attained by zero-filling the quadrants in such a manner as to obtain N pieces of data in each of the column and row directions for increasing the data to N×N pieces.

Computation of the absolute value can be omitted by taking into account the phase at the time of obtaining the NMR signal and linear changes caused in the phase by zero-filling, and instead of such computation of the absolute value, $F_0$ may be replaced with either the real part or the imaginary part of $_0$.

Since Fourier transformation is possible with respect to any cardinal, M need not be a power of 2, and N may be an arbitrary multiple of M as well.

Figure 2:
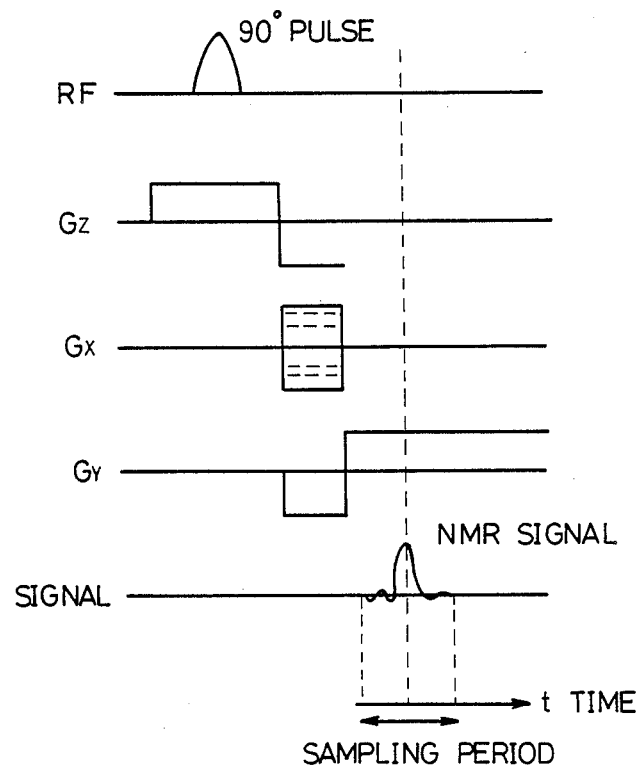
FIG. 2 shows a sequence for producing an NMR signal.

Furthermore, the numbers of data in the column and row directions need not be equal to each other. And after A-D conversion of the NMR signal is repeated N times during the sampling period shown in FIG. 2, the signal may be Fourier-transformed posterior to zero-filling executed merely in the column direction (phase encoding direction). In this case, a more enhanced resolution of the MR image is ensured in the row direction (frequency encoding direction) as compared with another case where zero-filling is executed in both directions.

Thus, according to the present invention, interpolative extension of an MR image is performed by first zero-filling the two-dimensional data of a sampled NMR signal in at least one of the column and row directions in conformity with the extension rate and then Fourier-transforming the data two-dimensionally, so that it becomes possible to form an interpolatively extended distinct MR image where the spatial frequency component included therein is not varied at all to consequently induce no reduction in the resolution. Furthermore, due to the interpolative extension based on fast Fourier transformation which is frequently utilized currently for forming an MR image, additional installation of any particular device is not required at all and still a high resolution is attainable in performing rapid interpolative extension of the image.

What is claimed is:

1. A method for extending a two-dimensional nuclear magnetic image array filled with sampling data obtained by the step of two-dimensionally sampling a nuclear magnetic resonance signal representative of a predetermined characteristic of specific atomic nuclei in a test piece, comprising the steps of: creating a two-dimensional extension array which is larger than said image array and which has a portion equal in size to and containing said sampling data from said image array; zero filling all of said extension array other than said portion thereof; and thereafter two-dimensionally Fourier-transforming said extension array.

2. The method of claim 1, wherein said extension array has four quadrants of equal size, and wherein one of said quadrants is said portion of said extension array.

3. The method of claim 1, including after said step of Fourier-transforming the step of determining the absolute value of said extension array.

4. The method of claim 1, wherein said predetermined characteristic is one of spin density and relaxation time.

5. The method of claim 1, wherein said image array is an M×M array, said extension array is an N x N array, and N>M.

6. The method of claim 5, wherein N=2M.

7. A method of processing nuclear magnetic image data, comprising the steps of: obtaining a first predetermined number of data samples by sampling a nuclear magnetic resonance signal representative of a predetermined characteristic of specific atomic nuclei in a test piece; creating an extension array having a second predetermined number of elements, said second predetermined number being larger than said first predetermined number, and said extension array including an image portion which is an array and which includes a plurality of said elements equal in number to said first predetermined number and each containing a respective said data sample; setting each said element of said array other than said elements in said image portion thereof to zero; thereafter two-dimensionally Fourier transforming said extension array; and thereafter displaying each of said second predetermined number of elements of said expansion array.

8. The method of claim 7, wherein said image portion is an M x M array, said extension array is an N×N array, and N >M.

9. The method of claim 8, wherein N=2M.

10. The method of claim 7, including after said Fourier transforming step and before said displaying step the step of taking the absolute value of said extension array.

11. The method of claim 7, wherein said image portion is a P×Q array and said extension array is an R×S array, where R≧P, and S≧Q, and RS>PQ.

* * * * *